(12) United States Patent
Kim et al.

(10) Patent No.: US 12,356,099 B2
(45) Date of Patent: Jul. 8, 2025

(54) IMAGE SENSOR AND OPERATING METHOD THEREOF

(71) Applicant: SK hynix Inc., Gyeonggi-do (KR)

(72) Inventors: Min Kyu Kim, Gyeonggi-do (KR); Jong Hyun Ra, Gyeonggi-do (KR); Jin Ho Seo, Gyeonggi-do (KR); Kyoung Mook Lim, Gyeonggi-do (KR); Hoe Sam Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 281 days.

(21) Appl. No.: 17/958,525

(22) Filed: Oct. 3, 2022

(65) Prior Publication Data

US 2023/0300486 A1  Sep. 21, 2023

(30) Foreign Application Priority Data

Mar. 17, 2022 (KR) .................. 10-2022-0033323

(51) Int. Cl.
*H04N 25/75* (2023.01)
*H04N 23/10* (2023.01)
*H04N 25/778* (2023.01)
*H10F 39/00* (2025.01)

(52) U.S. Cl.
CPC .......... *H04N 25/75* (2023.01); *H04N 23/125* (2023.01); *H04N 25/778* (2023.01); *H10F 39/8053* (2025.01)

(58) Field of Classification Search
CPC .... H04N 25/75; H04N 23/125; H04N 25/778; H04N 25/40; H04N 25/46; H04N 25/42; H04N 23/84; H04N 25/59; H01L 27/14621
See application file for complete search history.

(56) References Cited

U.S. PATENT DOCUMENTS

| | | | |
|---|---|---|---|
| 2009/0066782 A1* | 3/2009 | Choi | H04N 25/46 348/E5.022 |
| 2015/0350583 A1* | 12/2015 | Mauritzson | H01L 27/14621 257/432 |
| 2019/0335110 A1* | 10/2019 | Kobayashi | H04N 25/134 |
| 2021/0006761 A1 | 1/2021 | Choi et al. | |
| 2021/0136303 A1* | 5/2021 | Kim | H04N 25/76 |
| 2021/0151485 A1* | 5/2021 | Ma | H01L 27/14627 |
| 2021/0377496 A1* | 12/2021 | Kim | H04N 25/702 |
| 2023/0199341 A1* | 6/2023 | Ui | H04N 25/778 348/302 |

* cited by examiner

*Primary Examiner* — Timothy J Henn
(74) *Attorney, Agent, or Firm* — IP & T GROUP LLP

(57) ABSTRACT

Disclosed is an image sensor including a first sub-pixel array including a plurality of first pixel groups, which are respectively coupled to a plurality of first readout lines extending in a first direction and are adjacent to one another in a second direction intersecting the first direction; and a plurality of first switches suitable for selectively coupling a plurality of first floating diffusion nodes included in the plurality of first pixel groups, based on a plurality of first control signals.

17 Claims, 12 Drawing Sheets

IMAGE SENSOR AND OPERATING METHOD THEREOF

CROSS-REFERENCE TO RELATED APPLICATION(S)

This application claims priority under 35 U.S.C. § 119 to Korean Patent Application No. 10-2022-0033323, filed on Mar. 17, 2022, the disclosure of which is incorporated herein by reference in its entirety.

BACKGROUND

1. Field

Various embodiments of the present disclosure relate to a semiconductor design technique, and more particularly, to an image sensor that supports a sum mode, and an operating method of the image sensor.

2. Description of the Related Art

Image sensors are devices for capturing images using the property of a semiconductor which reacts to light. Image sensors may be roughly classified into charge-coupled device (CCD) image sensors and complementary metal-oxide semiconductor (CMOS) image sensors. Recently, CMOS image sensors are widely used because the CMOS image sensors can allow both analog and digital control circuits to be directly implemented on a single integrated circuit (IC).

SUMMARY

Various embodiments of the present disclosure are directed to an image sensor that may support a sum mode even though an arrangement pattern of pixels included in a pixel group and an arrangement pattern of color filters of a pixel array are different from each other, and an operating method of the image sensor.

In accordance with an embodiment of the present disclosure, an image sensor may include: a first sub-pixel array including a plurality of first pixel groups, which are respectively coupled to a plurality of first readout lines extending in a first direction and are adjacent to one another in a second direction intersecting the first direction; and a plurality of first switches suitable for selectively coupling a plurality of first floating diffusion nodes included in the plurality of first pixel groups, based on a plurality of first control signals.

In accordance with an embodiment of the present disclosure, an image sensor may include: a first sub-pixel array including a plurality of first pixel groups, which are respectively coupled to a plurality of first readout lines extending in a vertical direction and are adjacent to one another in a horizontal direction; a plurality of first switches suitable for selectively coupling a plurality of first floating diffusion nodes included in the plurality of first pixel groups, based on a plurality of first control signals; a second sub-pixel array including a plurality of second pixel groups, which are respectively coupled to a plurality of second readout lines extending in the vertical direction and are adjacent to one another in the horizontal direction; a plurality of second switches suitable for selectively coupling a plurality of second floating diffusion nodes included in the plurality of second pixel groups, based on a plurality of second control signals; a third sub-pixel array including a plurality of third pixel groups, which are respectively coupled to the plurality of second readout lines and are adjacent to one another in the horizontal direction; a plurality of third switches suitable for selectively coupling a plurality of third floating diffusion nodes included in the plurality of third pixel groups, based on a plurality of third control signals; a fourth sub-pixel array including a plurality of fourth pixel groups, which are respectively coupled to the plurality of first readout lines and are adjacent to one another in the horizontal direction; and a plurality of fourth switches suitable for selectively coupling a plurality of fourth floating diffusion nodes included in the plurality of fourth pixel groups, based on a plurality of fourth control signals, wherein the first to fourth sub-pixel arrays are adjacent to one another in the vertical direction.

In accordance with an embodiment of the present disclosure, an operating method of an image sensor may include: coupling a first floating diffusion node included in a first pixel group to a second floating diffusion node included in a second pixel group among the first and second pixel groups and a third pixel group, and reading out at least one synthesized first pixel signal from some or all first pixels corresponding to a first color filter group in a first sub-pixel array including the first to third pixel groups, during a first time section; coupling the second floating diffusion node included in the second pixel group to a third floating diffusion node included in the third pixel group among the first to third pixel groups, and reading out at least one synthesized second pixel signal from some or all second pixels corresponding to a second color filter group in the first sub-pixel array, during a second time section; coupling the first floating diffusion node included in the first pixel group to the second floating diffusion node included in the second pixel group among the first to third pixel groups, and reading out at least one synthesized third pixel signal from some or all third pixels corresponding to a third color filter group in the first sub-pixel array, during a third time section; and coupling the second floating diffusion node included in the second pixel group to the third floating diffusion node included in the third pixel group among the first to third pixel groups, and reading out at least one synthesized fourth pixel signal from some or all fourth pixels corresponding to a fourth color filter group in the first sub-pixel array, during a fourth time section.

In accordance with an embodiment of the present disclosure, an image sensor may include: an array of even-numbered pixels that are grouped into at least first to third pixel groups of 1×3 arrangement having respective first to third floating nodes while grouped into at least first to fourth color filter groups of 2×2 arrangement; and a control circuit configured to readout: during a first time section, a first pixel signal from the first color filter group by coupling the first and second floating nodes, during a second time section, a second pixel signal from the second color filter group by coupling the second and third floating nodes, during a third time section, a third pixel signal from the third color filter group by coupling the first and second floating nodes, and during a fourth time section, a fourth pixel signal from the fourth color filter group by coupling the second and third floating nodes.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
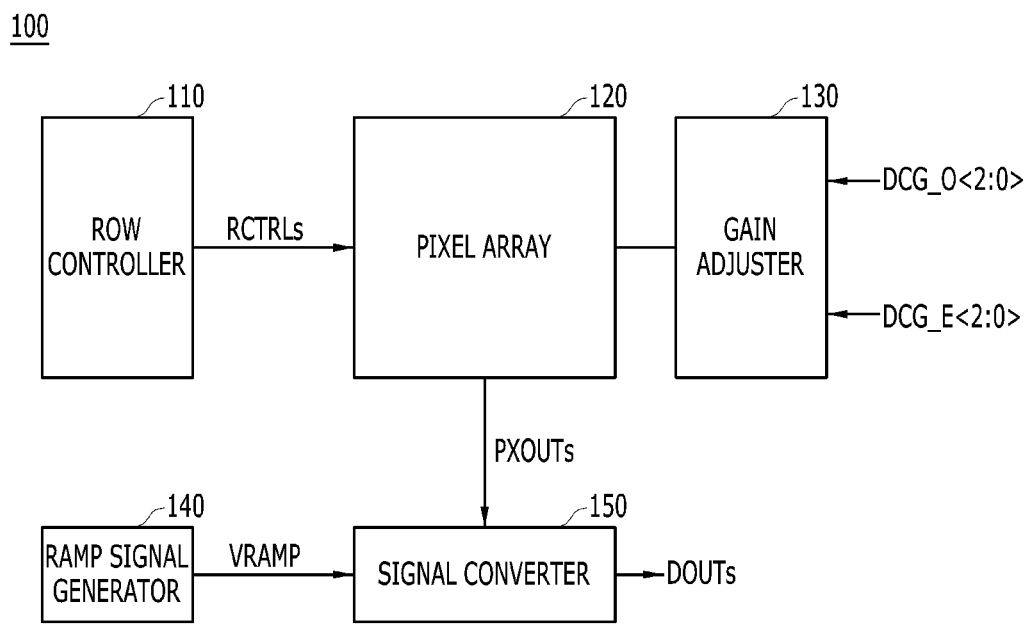
FIG. 1 is a block diagram illustrating an image sensor in accordance with an embodiment of the present disclosure.

FIG. 1 is a block diagram illustrating an image sensor 100 in accordance with an embodiment of the present disclosure.

Referring to FIG. 1, the image sensor 100 may include a row controller 110, a pixel array 120, a gain adjuster 130, a ramp signal generator 140 and a signal converter 150.

The row controller 110 may generate row control signals RCTRLs for controlling the pixel array 120 for each row. For example, the row controller 110 may generate first row control signals for controlling pixels arranged in a first row of the pixel array 120, and generate $y^{th}$ row control signals for controlling pixels arranged in an $y^{th}$ row of the pixel array 120, where "y" is a natural number greater than 2. The row control signals RCTRLs may include the first to $y^{th}$ row control signals.

The pixel array 120 may include a plurality of pixels arranged at intersections of a plurality of rows and a plurality of columns. The plurality of pixels may output a plurality of pixel signals PXOUTs, which correspond to at least one row, on the basis of the row control signals RCTRLs. The pixel array 120 may include a plurality of sub-pixel arrays (refer to FIG. 2).

The gain adjuster 130 may be coupled to the pixel array 120. The gain adjuster 130 may adjust conversion gains of the plurality of pixels (refer to FIG. 4).

The ramp signal generator 140 may generate a ramp signal VRAMP. The ramp signal VRAMP may ramp in a predetermined pattern, and be repeatedly generated.

Figure 5:
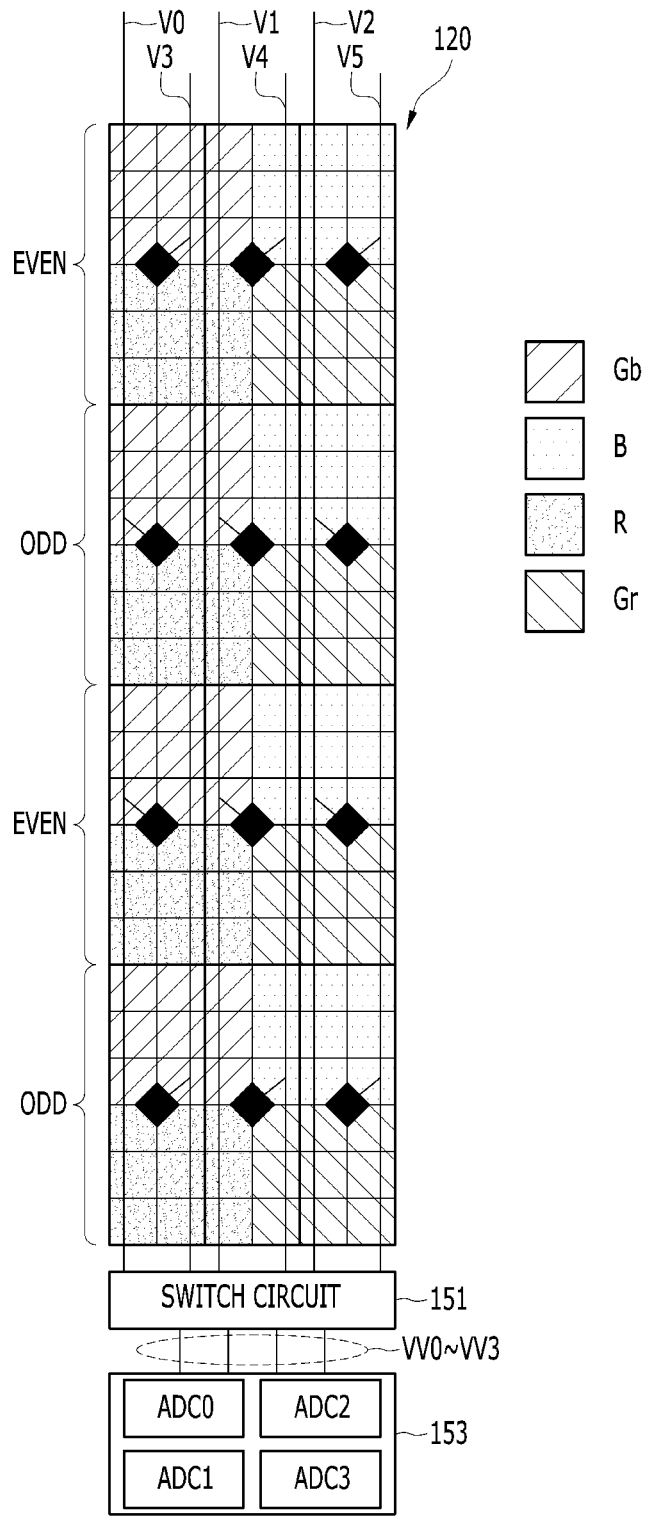
FIG. 5 is a block diagram illustrating an example of the pixel array and a signal converter illustrated in FIG. 1 in accordance with an embodiment of the present disclosure.

The signal converter 150 may generate a plurality of code signals DOUTs on the basis of the ramp signal VRAMP and the plurality of pixel signals PXOUTs (refer to FIG. 5).

Figure 2:
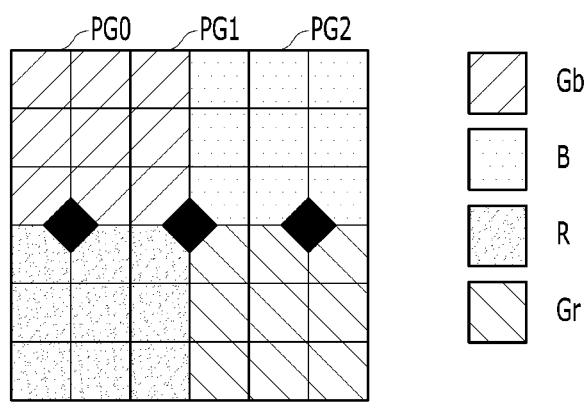
FIG. 2 is a diagram illustrating an example of one of a plurality of sub-pixel arrays included in a pixel array illustrated in FIG. 1 in accordance with an embodiment of the present disclosure.

FIG. 2 is a diagram illustrating one of a plurality of sub-pixel arrays included in the pixel array 120 illustrated in FIG. 1 in accordance with an embodiment of the present disclosure.

Referring to FIG. 2, the sub-pixel array may include 6×6 pixels having color filters in units of nona, that is, first to fourth color filter groups, and arranged in a Bayer pattern. For example, the sub-pixel array may include a first array disposed on the top left, a second array disposed on the top right, a third array disposed on the bottom right, and a fourth array disposed on the bottom left. The first array may include first 3×3 pixels, and the first 3×3 pixels may have odd-numbered, i.e., 3×3, green filters Gb, that is, the first color filter group. The second array may include second 3×3 pixels, and the second 3×3 pixels may have odd-numbered, i.e., 3×3, blue filters B, that is, the second color filter group. The third array may include third 3×3 pixels, and the third 3×3 pixels may have odd-numbered, i.e., 3×3, green filters Gr, that is, the third color filter group. The fourth array may include fourth 3×3 pixels, and the fourth 3×3 pixels may have odd-numbered, i.e., 3×3, red filters R, that is, the fourth color filter group. The green filters Gb, the blue filters B, the green filters Gr and the red filters R may be arranged in various ways according to the Bayer pattern.

The sub-pixel array may include odd-numbered pixel groups. For example, the sub-pixel array may include first to third pixel groups PG0, PG1 and PG2. The first pixel group PG0 may include 2×6 pixels arranged on one side of the 6×6 pixels. For example, the first pixel group PG0 may include 2×3 pixels having the green filters Gb and 2×3 pixels having the red filters R. The second pixel group PG1 may include 2×6 pixels arranged in the center of the 6×6 pixels. For example, the second pixel group PG1 may include 1×3 pixels having the green filters Gb, 1×3 pixels having the blue filters B, 1×3 pixels having the green filters Gr and 1×3 pixels having the red filters R. The third pixel group PG2 may include 2×6 pixels arranged on the other side of the 6×6 pixels. For example, the third pixel group PG2 may include 2×3 pixels having the blue filters B and 2×3 pixels having the green filters Gr. It may be seen that an arrangement pattern of the pixels included in each of the first to third pixel groups PG0, PG1 and PG2 and an arrangement pattern of the color filters of the sub-pixel array are different from each other. The arrangement pattern of each of the first to third pixel groups PG0, PG1 and PG2 may correspond to a first arrangement pattern of even-numbered color filters of even-numbered, i.e., 2×6=12, pixels. Unlike this, the arrangement pattern of each of the first to fourth color filter groups may correspond to a second arrangement pattern of groups each having odd-numbered color filters of odd-numbered, i.e., 3×3=9, pixels.

Each of the 6×6 pixels included in the sub-pixel array may be an active pixel. However, the present disclosure is not limited thereto, and at least one of the 6×6 pixels may be a phase detection pixel.

Figure 3:
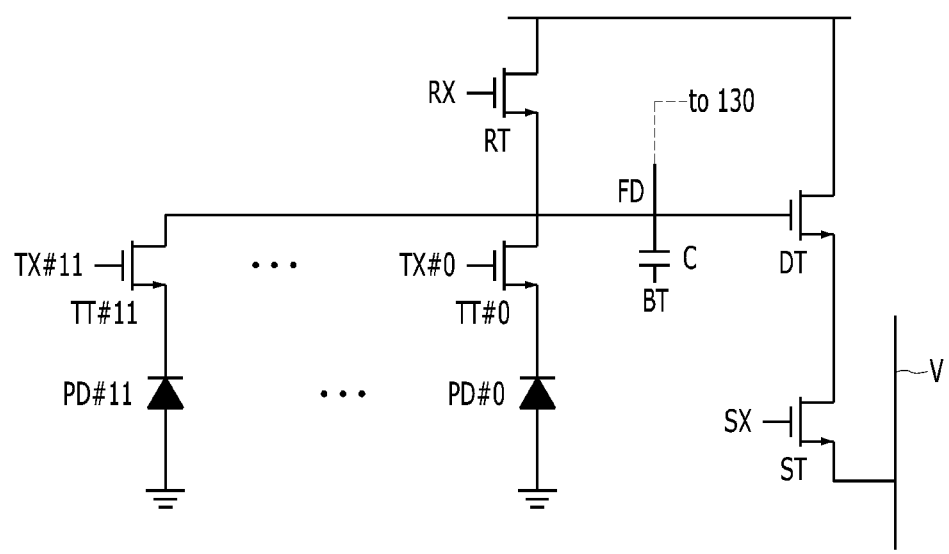
FIG. 3 is a circuit diagram illustrating an example of one of a plurality of pixel groups illustrated in FIG. 2 in accordance with an embodiment of the present disclosure.

FIG. 3 is a circuit diagram illustrating one of the first to third pixel groups PG0, PG1 and PG2 illustrated in FIG. 2 in accordance with an embodiment of the present disclosure.

Referring to FIG. 3, the one pixel group may have a structure in which 2×6 pixels share some circuits. For example, the pixel group may include 12 photodiodes PD #0 to PD #11, 12 transmission elements TT #0 to TT #11, one reset element RT, one floating diffusion node FD, one boost element C, one driving element DT and one selection element ST. The 12 photodiodes PD #0 to PD #11 and the transmission elements TT #0 to TT #11 may share the reset element RT, the floating diffusion node FD, the boost element C, the driving element DT and the selection element ST.

The 12 photodiodes PD #0 to PD #11 may be coupled between a low-voltage supply terminal and the respective 12 transmission elements TT #0 to TT #11.

The 12 transmission elements TT #0 to TT #11 may be coupled between the respective 12 photodiodes PD #0 to PD #11 and the floating diffusion node FD. The 12 transmission elements TT #0 to TT #11 may selectively couple the respective 12 photodiodes PD #0 to PD #11 to the floating diffusion node FD on the basis of 12 transmission control signals TX #0 to TX #11, respectively.

The reset element RT may be coupled between a high-voltage supply terminal and the floating diffusion node FD. The reset element RT may selectively couple the high-voltage supply terminal to the floating diffusion node FD on the basis of a reset control signal RX.

The floating diffusion node FD may store charges transmitted from at least one of the 12 photodiodes PD #0 to PD #11. For example, a parasitic capacitor (not illustrated) capable of storing the charges may be coupled to the floating diffusion node FD. The floating diffusion node FD may be coupled to the gain adjuster 130.

The boost element C may boost the floating diffusion node FD according to a boost voltage BT. The boost element C and the boost voltage BT need not necessarily be included.

The driving element DT may be coupled among the floating diffusion node FD, the high-voltage supply terminal and the selection element ST. The driving element DT may drive a pixel signal with a high voltage on the basis of a voltage loaded on the floating diffusion node FD.

The selection element ST may be coupled between the driving element DT and a readout line V. The selection element ST may output the pixel signal to the readout line V on the basis of a selection control signal SX.

Figure 4:
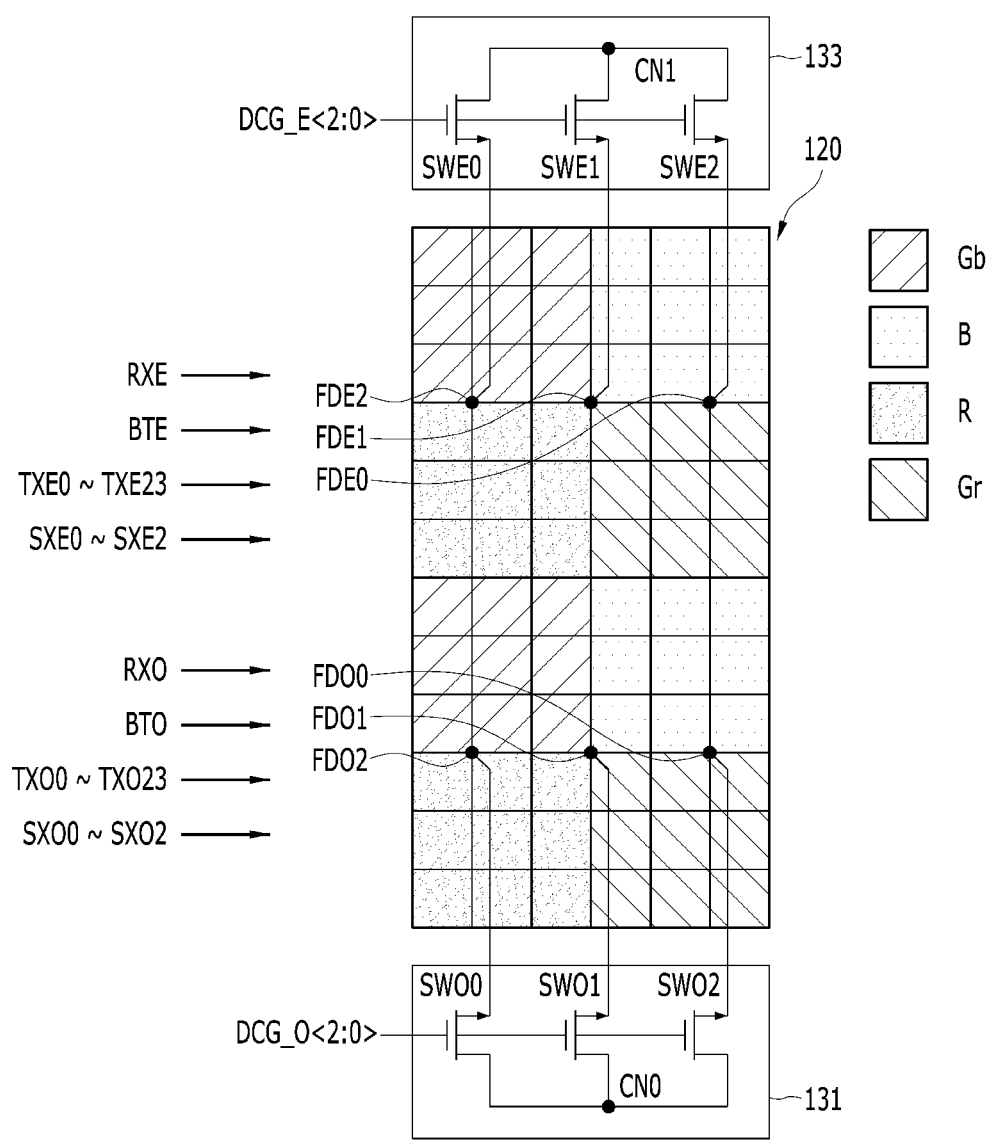
FIG. 4 is a block diagram illustrating an example of the pixel array and a gain adjuster illustrated in FIG. 1 in accordance with an embodiment of the present disclosure.

FIG. 4 is a block diagram illustrating the pixel array 120 and the gain adjuster 130 illustrated in FIG. 1 in accordance with an embodiment of the present disclosure.

FIG. 4 illustrates that the pixel array 120 includes first and second sub-pixel arrays. Each of the first and second sub-pixel arrays may correspond to the sub-pixel array illustrated in FIG. 2. Hereinafter, the first sub-pixel array is referred to as an "odd-numbered sub-pixel array", and the second sub-pixel array is referred to as an "even-numbered sub-pixel array".

The odd-numbered sub-pixel array may include first to third pixel groups. The first to third pixel groups may correspond to the first to third pixel groups PG0, PG1 and PG2, respectively, illustrated in FIG. 2. The first to third pixel groups may include first to third floating diffusion nodes FDO0, FDO1 and FDO2, respectively. The odd-numbered sub-pixel array may generate pixel signals on the basis of a reset control signal RXO, a boost voltage BTO, first to $24^{th}$ transmission control signals TXO0 to TXO23, and first to third selection control signals SXO0 to SXO2.

The even-numbered sub-pixel array may include first to third pixel groups. The first to third pixel groups may correspond to the first to third pixel groups PG0, PG1 and PG2, respectively, illustrated in FIG. 2. The first to third pixel groups may include first to third floating diffusion nodes FDE0, FDE1 and FDE2, respectively. The even-numbered sub-pixel array may generate pixel signals on the basis of a reset control signal RXE, a boost voltage BTE, first to $24^{th}$ transmission control signals TXE0 to TXE23, and first to third selection control signals SXE0 to SXE2.

The gain adjuster 130 may include a first switch circuit 131 and a second switch circuit 133.

The first switch circuit 131 may be coupled to the odd-numbered sub-pixel array. For example, the first switch circuit 131 may be coupled to the first to third floating diffusion nodes FDO0, FDO1 and FDO2. The first switch circuit 131 may include first to third switches SWO0, SWO1 and SWO2. The first switch SWO0 may be coupled between the first floating diffusion node FDO0 and a first common node CN0. The first switch SWO0 may selectively couple the first floating diffusion node FDO0 to the first common node CN0 on the basis of a first control signal DCG_O<0>. The second switch SWO1 may be coupled between the second floating diffusion node FDO1 and the first common node CN0. The second switch SWO1 may selectively couple the second floating diffusion node FDO1 to the first common node CN0 on the basis of a second control signal DCG_O<1>. The third switch SWO2 may be coupled between the third floating diffusion node FDO2 and the first common node CN0. The third switch SWO2 may selectively couple the third floating diffusion node FDO2 to the first common node CN0 on the basis of a third control signal DCG_O<2>.

The first switch circuit 131 may increase or decrease capacitance for storing the charges by selectively coupling the first to third floating diffusion nodes FDO0, FDO1 and FDO2 to the first common node CN0 on the basis of the first to third control signals DCG_O<2:0>. For example, the first switch circuit 131 may electrically isolate the first to third floating diffusion nodes FDO0, FDO1 and FDO2 from the first common node CN0, or electrically couple some or all of the first to third floating diffusion nodes FDO0, FDO1 and FDO2 to the first common node CN0, depending on a mode. The mode may be one of a normal mode, a first sum mode and a second sum mode. The normal mode, the first sum mode and the second sum mode are described below.

The second switch circuit 133 may be coupled to the even-numbered sub-pixel array. For example, the second switch circuit 133 may be coupled to the first to third floating diffusion nodes FDE0, FDE1 and FDE2. The second switch circuit 133 may include first to third switches SWE0, SWE1 and SWE2. The first switch SWE0 may be coupled between the first floating diffusion node FDE0 and a second common node CN1. The first switch SWE0 may selectively couple the first floating diffusion node FDE0 to the second common node CN1 on the basis of a first control signal DCG_E<0>. The second switch SWE1 may be coupled between the second floating diffusion node FDE1 and the second common node CN1. The second switch SWE1 may selectively couple the second floating diffusion node FDE1 to the second common node CN1 on the basis of a second control signal DCG_E<1>. The third switch SWE2 may be coupled between the third floating diffusion node FDE2 and the second common node CN1. The third switch SWE2 may selectively couple the third floating diffusion node FDE2 to the second common node CN1 on the basis of a third control signal DCG_E<2>.

The second switch circuit 133 may increase or decrease capacitance for storing the charges by selectively coupling the first to third floating diffusion nodes FDE0, FDE1 and FDE2 to the second common node CN1 on the basis of the first to third control signals DCG_E<2:0>. For example, the second switch circuit 133 may electrically isolate the first to third floating diffusion nodes FDE0, FDE1 and FDE2 from the second common node CN1, or electrically couple some or all of the first to third floating diffusion nodes FDE0, FDE1 and FDE2 to the second common node CN1, depending on a mode. The mode may be one of the normal mode, the first sum mode and the second sum mode.

FIG. 5 is a block diagram illustrating the pixel array 120 and the signal converter 150 illustrated in FIG. 1 in accordance with an embodiment of the present disclosure.

Referring to FIG. 5, the pixel array 120 may include first to fourth sub-pixel arrays. Each of the first to fourth sub-pixel arrays may correspond to the sub-pixel array illustrated in FIG. 2. The first to fourth sub-pixel arrays may be adjacent to one another in a first direction, that is, a vertical direction. Each of the first and third sub-pixel arrays may be an odd-numbered sub-pixel array, and each of the second and fourth sub-pixel arrays may be an even-numbered sub-pixel array.

The first sub-pixel array may include first to third pixel groups as described with reference to FIG. 4. The first to third pixel groups may be coupled to first to third readout lines V0, V1 and V2, respectively, extending in the first direction. The first to third pixel groups may be adjacent to one another in a second direction, that is, a horizontal direction, which intersects the first direction.

The second sub-pixel array may include first to third pixel groups as described with reference to FIG. 4. The first to third pixel groups may be coupled to fourth to sixth readout lines V3, V4 and V5, respectively, extending in the first direction. The first to third pixel groups may be adjacent to one another in the second direction.

The third sub-pixel array may include first to third pixel groups. The first to third pixel groups may be coupled to the fourth to sixth readout lines V3, V4 and V5, respectively. The first to third pixel groups may be adjacent to one another in the second direction.

The fourth sub-pixel array may include first to third pixel groups. The first to third pixel groups may be coupled to the first to third readout lines V0, V1 and V2, respectively. The first to third pixel groups may be adjacent to one another in the second direction.

The signal converter 150 may include a switch circuit 151 and a signal conversion circuit 153.

The switch circuit 151 may selectively couple the first to sixth readout lines V0, V1, V2, V3, V4 and V5 to first to fourth lines VV0 to VV3. For example, the switch circuit 151 may select four readout lines from among the first to sixth readout lines V0, V1, V2, V3, V4 and V5 in a predetermined sequence according to the mode, and couple the selected readout lines to the first to fourth lines VV0 to VV3, respectively.

The signal conversion circuit 153 may include first to fourth analog/digital converters ADC0 to ADC3. The first analog/digital converter ADC0 may be coupled to the first line VV0. The first analog/digital converter ADC0 may convert a first pixel signal, which is read out through the first line VV0, into a first pixel code. The second analog/digital converter ADC1 may be coupled to the second line VV1. The second analog/digital converter ADC1 may convert a second pixel signal, which is read out through the second line VV1, into a second pixel code. The third analog/digital converter ADC2 may be coupled to the third line VV2. The third analog/digital converter ADC2 may convert a third pixel signal, which is read out through the third line VV2, into a third pixel code. The fourth analog/digital converter ADC3 may be coupled to the fourth line VV3. The fourth analog/digital converter ADC3 may convert a fourth pixel signal, which is read out through the fourth line VV3, into a fourth pixel code.

Hereinafter, an operation of the image sensor 100 in accordance with an embodiment of the present disclosure, which has the above-described configuration, is described with reference to FIGS. 6 to 12.

Figure 6:
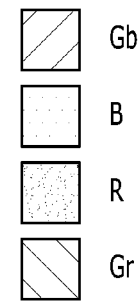
FIG. 6 is a diagram illustrating an example of matching between the pixel array and transmission control signals for describing an operation of the image sensor in accordance with an embodiment of the present disclosure illustrated in FIG. 1.

FIG. 6 is a diagram illustrating an example of matching between the pixel array 120 and the transmission control signals TXO0 to TXO3 for describing an operation of the image sensor 100 in accordance with an embodiment of the present disclosure illustrated in FIG. 1.

As illustrated in FIG. 6, the first sub-pixel array may include 6×6 pixels, but be controlled by the first to $24^{th}$ transmission control signals TXO0 to TXO23. This is because some of the plurality of pixels included in the first sub-pixel array may be controlled by the same transmission control signals TXO0, TXO1, TXO4, TXO5, TXO8, TXO9, TXO12, TXO13, TXO16, TXO17, TXO20 and TXO21.

The second sub-pixel array may also include 6×6 pixels, but be controlled by the first to $24^{th}$ transmission control signals TXE0 to TXE23. This is because some of the plurality of pixels included in the second sub-pixel array may be controlled by the same transmission control signals TXE0, TXE1, TXE4, TXE5, TXE8, TXE9, TXE12, TXE13, TXE16, TXE17, TXE20 and TXE21.

Hereinafter, the operation of the image sensor 100 is described for each mode on the premise that the pixel array 120 and the transmission control signals TXO0 to TXO23 and TXE0 to TXE23 are matched, as described with reference to FIG. 6.

An operation of the image sensor 100 according to the normal mode is described with reference to FIGS. 7 and 8.

Figure 7:
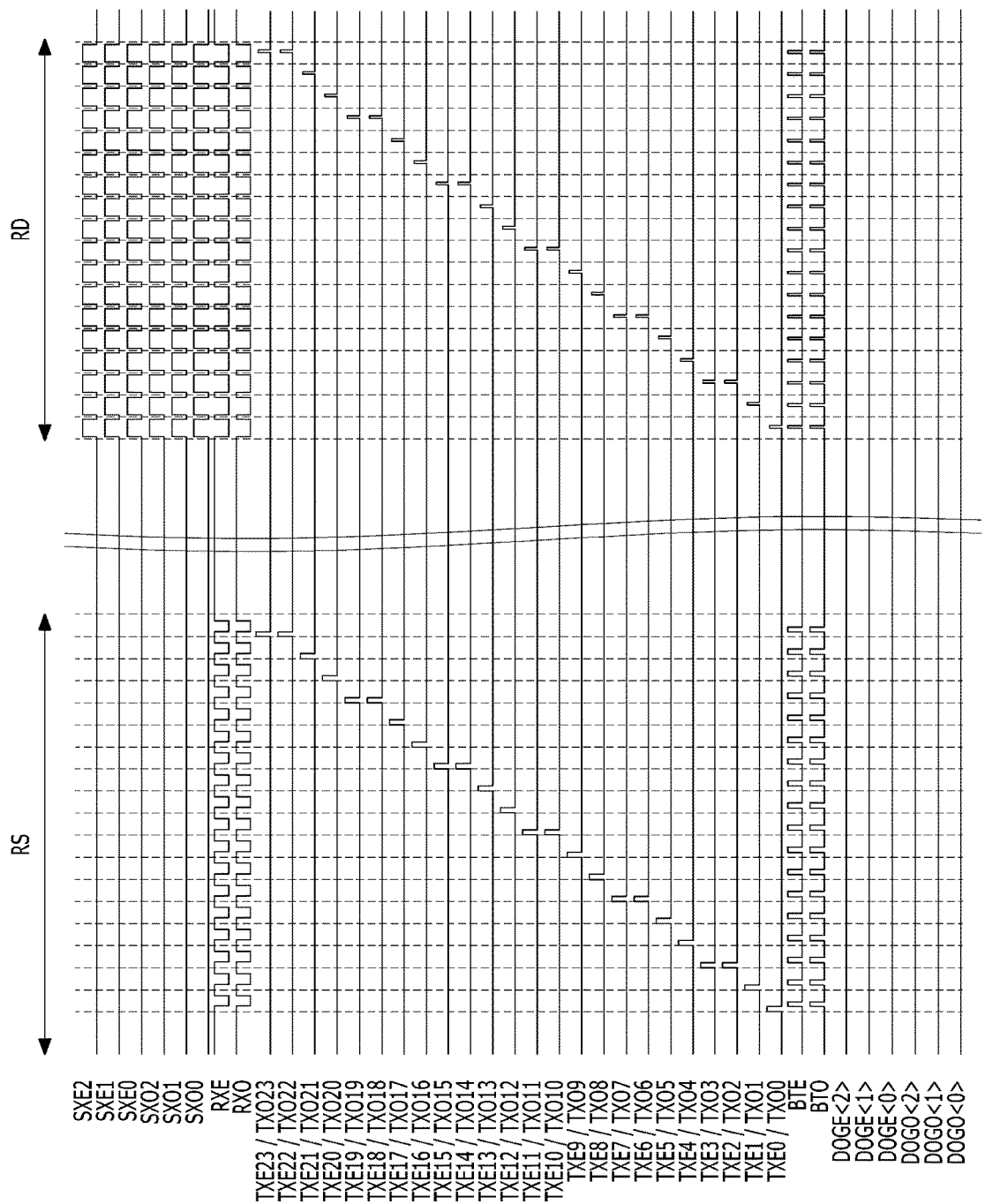
FIG. 7 is a timing diagram illustrating an operation of the image sensor illustrated in FIG. 1 according to a normal mode in accordance with an embodiment of the present disclosure.

FIG. 7 is a timing diagram illustrating the operation of the image sensor 100 according to the normal mode in accordance with an embodiment of the present disclosure. FIG. 8 is a diagram additionally illustrating the operation of the image sensor according to the normal mode illustrated in FIG. 7 in accordance with an embodiment of the present disclosure.

Figure 8:
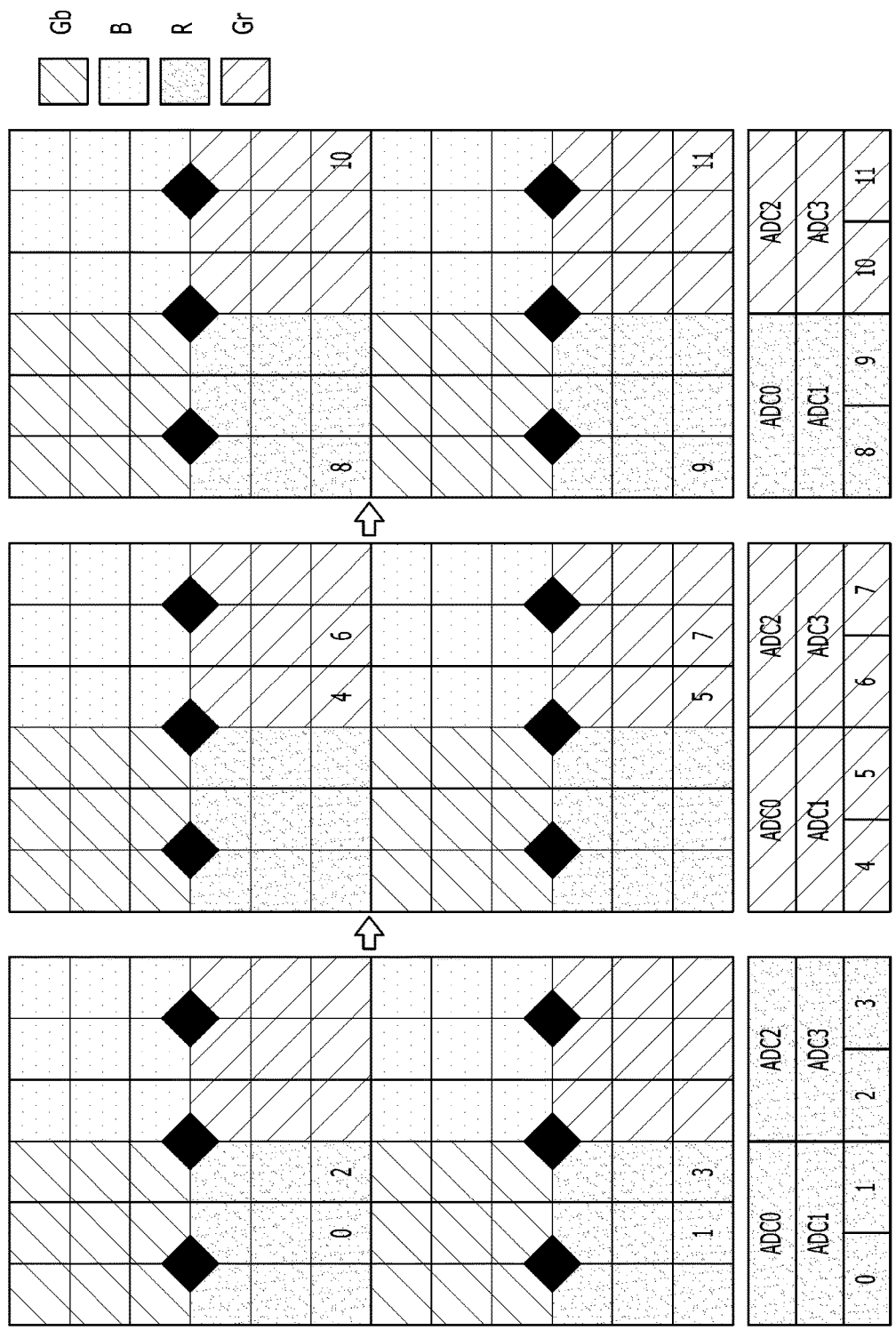
FIG. 8 is a diagram additionally illustrating the operation of the image sensor according to the normal mode illustrated in FIG. 7 in accordance with an embodiment of the present disclosure.

Referring to FIGS. 7 and 8 together, in the normal mode, the pixel signals PXOUTs may be individually read out from a plurality of pixels included in the pixel array 120.

The image sensor 100 may sequentially reset the plurality of pixels during a reset period RS. For example, charges remaining in first to $36^{th}$ photodiodes and the first to third floating diffusion nodes FDO0, FDO1 and FDO2 included in the first sub-pixel array may be emitted or removed, and charges remaining in first to $36^{th}$ photodiodes and the first to third floating diffusion nodes FDE0, FDE1 and FDE2 included in the second sub-pixel array may be emitted or removed.

The image sensor 100 may read out the pixel signals PXOUTs from the plurality of pixels during a readout period RD.

For example, the second sub-pixel array may output first and third pixel signals 0 and 2 on the basis of the first transmission control signal TXE0, and the first sub-pixel array may output second and fourth pixel signals 1 and 3 on the basis of the first transmission control signal TXO0. The first to fourth pixel signals 0 to 3 may be inputted to the first to fourth analog/digital converters ADC0, ADC1, ADC2 and ADC3 via the switch circuit 151. For example, the first and third pixel signals 0 and 2 may be outputted to the first and third analog/digital converters ADC0 and ADC2, respectively, through the respective fourth and fifth readout lines V3 and V4 and the respective first and third lines VV0 and VV2, and the second and fourth pixel signals 1 and 3 may be outputted to the second and fourth analog/digital converters ADC1 and ADC3, respectively, through the respective first and second readout lines V0 and V1 and the respective second and fourth lines VV1 and VV3.

Subsequently, the second sub-pixel array may output fifth and seventh pixel signals 4 and 6 on the basis of the second transmission control signal TXE1, and the first sub-pixel array may output sixth and eighth pixel signals 5 and 7 on the basis of the second transmission control signal TXO1. The fifth to eighth pixel signals 4 to 7 may be inputted to the first to fourth analog/digital converters ADC0, ADC1, ADC2 and ADC3 via the switch circuit 151. For example, the fifth and seventh pixel signals 4 and 6 may be outputted to the first and third analog/digital converters ADC0 and ADC2, respectively, through the respective fifth and sixth readout lines V4 and V5 and the respective first and third lines VV0 and VV2, and the sixth and eighth pixel signals 5 and 7 may be outputted to the second and fourth analog/digital converters ADC1 and ADC3, respectively, through the respective second and third readout lines V1 and V2 and the respective second and fourth lines VV1 and VV3.

Continuously, the second sub-pixel array may output ninth and 11$^{th}$ pixel signals 8 and 10 on the basis of the third and fourth transmission control signals TXE2 and TXE3, and the first sub-pixel array may output 10$^{th}$ and 12$^{th}$ pixel signals 9 and 11 on the basis of the third and fourth transmission control signals TXO2 and TXO3. The ninth to 12$^{th}$ pixel signals 8 to 11 may be inputted to the first to fourth analog/digital converters ADC0, ADC1, ADC2 and ADC3 via the switch circuit 151. For example, the ninth and 11$^{th}$ pixel signals 8 and 10 may be outputted to the first and third analog/digital converters ADC0 and ADC2, respectively, through the respective fourth and sixth readout lines V3 and V5 and the respective first and third lines VV0 and VV2, and the 10$^{th}$ and 12$^{th}$ pixel signals 9 and 11 may be outputted to the second and fourth analog/digital converters ADC1 and ADC3, respectively, through the respective first and third readout lines V0 and V2 and the respective second and fourth lines VV1 and VV3. The other pixel signals may be repeatedly read out for each row, and may be read out in the same readout order as that of the first to 12$^{th}$ pixel signals 0 to 11.

In the normal mode, as the first to third control signals DCG_O<2:0> are deactivated, the first to third switches SWO0, SWO1 and SWO2 may be continuously opened. Accordingly, the first to third floating diffusion nodes FDO0, FDO1 and FDO2 may be electrically isolated from one another. In the normal mode, as the first to third control signals DCG_E<2:0> are deactivated, the first to third switches SWE0, SWE1 and SWE2 may be continuously opened. Accordingly, the first to third floating diffusion nodes FDE0, FDE1 and FDE2 may be electrically isolated from one another.

Moreover, when at least one phase detection pixel is included in the first and second sub-pixel arrays, the process of reading out a pixel signal from the phase detection pixel in the normal mode may be omitted or performed.

Next, an operation of the image sensor 100 according to the first sum mode, i.e., the 3-sum mode, is described with reference to FIGS. 9 and 10.

Figure 9:
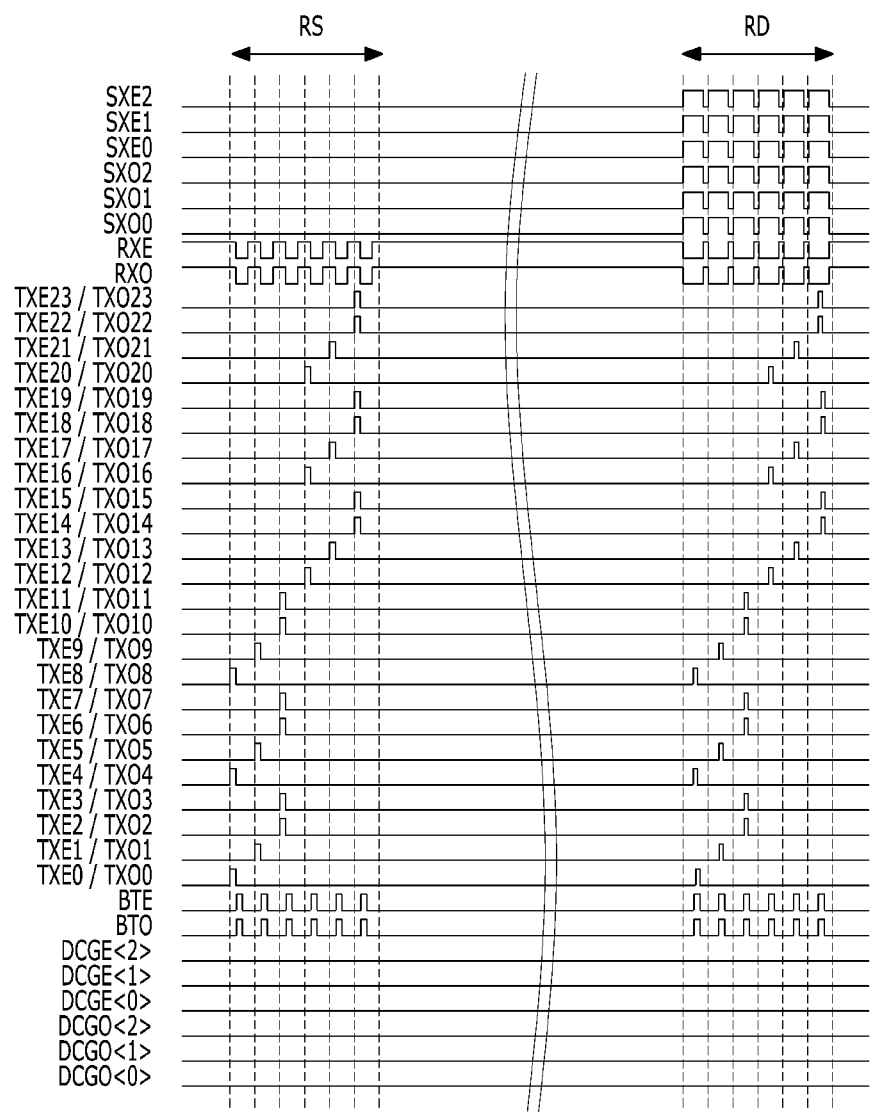
FIG. 9 is a timing diagram illustrating an operation of the image sensor illustrated in FIG. 1 according to a first sum mode, i.e., a 3-sum mode in accordance with an embodiment of the present disclosure.

FIG. 9 is a timing diagram illustrating the operation of the image sensor 100 according to the first sum mode in accordance with an embodiment of the present disclosure. FIG. 10 is a diagram additionally illustrating the operation of the image sensor 100 according to the first sum mode illustrated in FIG. 9 in accordance with an embodiment of the present disclosure.

Figure 10:
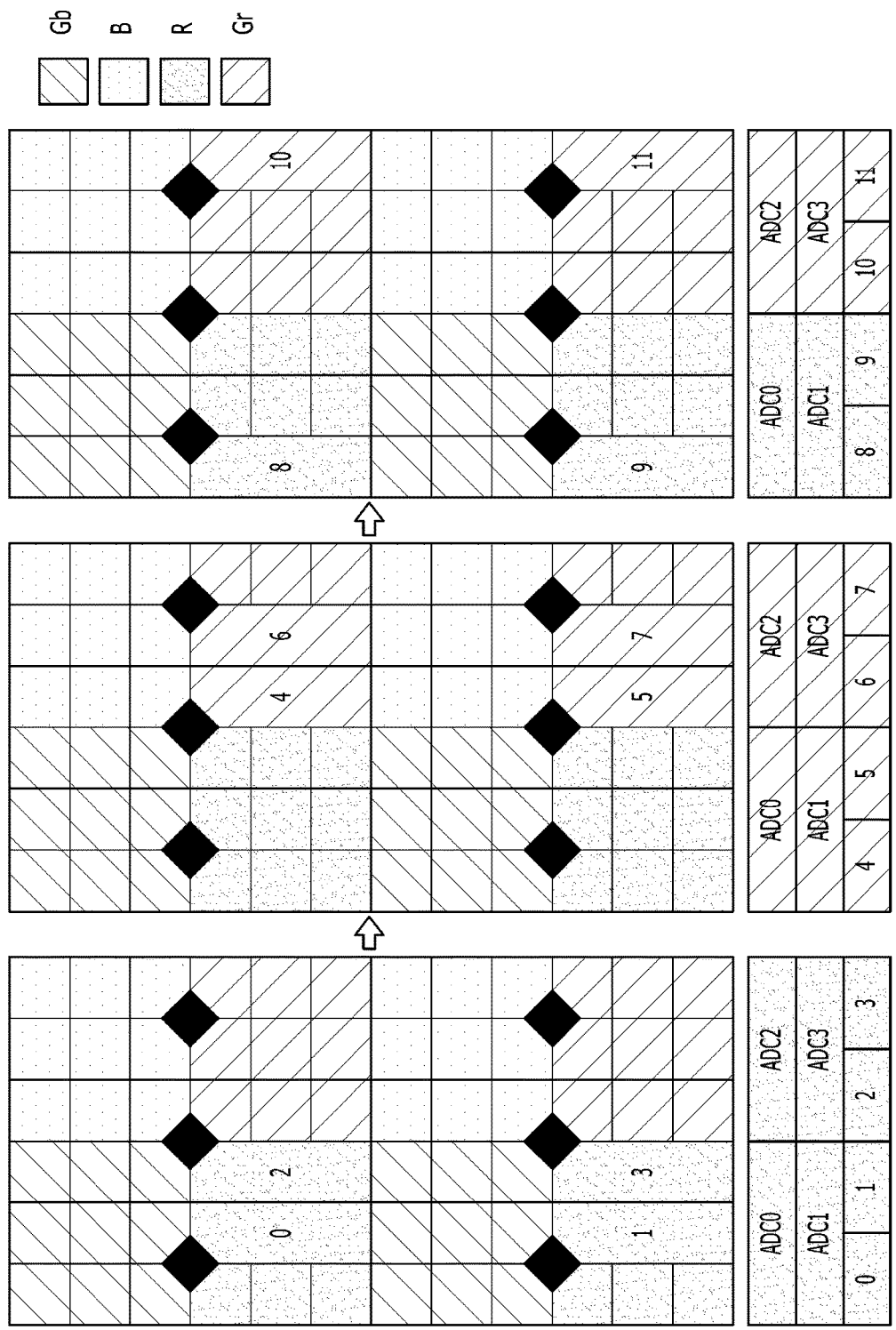
FIG. 10 is a diagram additionally illustrating the operation of the image sensor according to the first sum mode illustrated in FIG. 9 in accordance with an embodiment of the present disclosure.

Referring to FIGS. 9 and 10 together, in the first sum mode, the pixel signals PXOUTs synthesized from a plurality of pixels included in the pixel array 120 may be read out.

The image sensor 100 may reset the plurality of pixels in a predetermined first order during a reset period RS. For example, charges remaining in first to 36$^{th}$ photodiodes and the first to third floating diffusion nodes FDO0, FDO1 and FDO2 included in the first sub-pixel array may be emitted or removed, and charges remaining in first to 36$^{th}$ photodiodes and the first to third floating diffusion nodes FDE0, FDE1 and FDE2 included in the second sub-pixel array may be emitted or removed.

The image sensor 100 may read out the pixel signals PXOUTs synthesized from the plurality of pixels during a readout period RD.

For example, the second sub-pixel array may output first and third pixel signals 0 and 2 synthesized from some, i.e., 3 pixels, of pixels, i.e., 9 pixels, each having a red filter R, on the basis of the first, fifth and ninth transmission control signals TXE0, TXE4 and TXE8 simultaneously activated during a first time section, and the first sub-pixel array may output second and fourth pixel signals 1 and 3 synthesized from some, i.e., 3 pixels, of pixels, i.e., 9 pixels, each having a red filter R, on the basis of the first, fifth and ninth transmission control signals TXO0, TXO4 and TXO8 simultaneously activated during the first time section. The synthesized first to fourth pixel signals 0 to 3 may be inputted to the first to fourth analog/digital converters ADC0, ADC1, ADC2 and ADC3 via the switch circuit 151. For example, the synthesized first and third pixel signals 0 and 2 may be outputted to the first and third analog/digital converters ADC0 and ADC2, respectively, through the respective fourth and fifth readout lines V3 and V4 and the respective first and third lines VV0 and VV2, and the synthesized second and fourth pixel signals 1 and 3 may be outputted to the second and fourth analog/digital converters ADC1 and ADC3, respectively, through the respective first and second readout lines V0 and V1 and the respective second and fourth lines VV1 and VV3.

Subsequently, the second sub-pixel array may output fifth and seventh pixel signals 4 and 6 synthesized from some, i.e., 3 pixels, of pixels, i.e., 9 pixels, each having a green filter Gr, on the basis of the second, sixth and 10$^{th}$ transmission control signals TXE1, TXE5 and TXE9 simultaneously activated during a second time section, and the first sub-pixel array may output sixth and eighth pixel signals 5 and 7 synthesized from some, i.e., 3 pixels, of pixels, i.e., 9 pixels, each having a green filter Gr, on the basis of the second, sixth and 10$^{th}$ transmission control signals TXO1, TXO5 and TXO9 simultaneously activated during the second time section. The synthesized fifth to eighth pixel signals 4 to 7 may be inputted to the first to fourth analog/digital converters ADC0, ADC1, ADC2 and ADC3 via the switch circuit 151. For example, the synthesized fifth and seventh pixel signals 4 and 6 may be outputted to the first and third analog/digital converters ADC0 and ADC2, respectively, through the respective fifth and sixth readout lines V4 and V5 and the respective first and third lines VV0 and VV2, and the synthesized sixth and eighth pixel signals 5 and 7 may be outputted to the second and fourth analog/digital converters ADC1 and ADC3, respectively, through the respective second and third readout lines V1 and V2 and the respective second and fourth lines VV1 and VV3.

Continuously, the second sub-pixel array may output a ninth pixel signal 8 synthesized from some, i.e., the other 3 pixels, of pixels, i.e., 9 pixels, each having a red filter R, on the basis of the third, seventh and 11$^{th}$ transmission control signals TXE2, TXE6 and TXE10 simultaneously activated during a third time section, and output an 11$^{th}$ pixel signal 10 synthesized from some, i.e., the other 3 pixels, of pixels, i.e., 9 pixels, each having a green filter Gr, on the basis of the fourth, eighth and 12$^{th}$ transmission control signals TXE3, TXE7 and TXE11 simultaneously activated during the third time section. The first sub-pixel array may output a 10$^{th}$ pixel signal 9 synthesized from some, i.e., the other 3 pixels, of pixels, i.e., 9 pixels, each having a red filter R, on the basis of the third, seventh and 11$^{th}$ transmission control signals TXO2, TXO6 and TXO10 simultaneously activated during the third time section, and output a 12$^{th}$ pixel signal 11 synthesized from some, i.e., the other 3 pixels, of pixels, i.e., 9 pixels, each having a green filter Gr, on the basis of the fourth, eighth and 12$^{th}$ transmission control signals TXO3, TXO7 and TXO11 simultaneously activated during the third time section. The synthesized ninth to 12$^{th}$ pixel signals 8 to 11 may be inputted to the first to fourth analog/digital converters ADC0, ADC1, ADC2 and ADC3 via the switch circuit 151. For example, the synthesized ninth and 11$^{th}$ pixel signals 8 and 10 may be outputted to the first and third analog/digital converters ADC0 and ADC2, respectively, through the respective fourth and sixth readout lines V3 and V5 and the respective first and third lines VV0 and VV2, and the synthesized 10$^{th}$ and 12$^{th}$ pixel signals 9 and 11 may be outputted to the second and fourth analog/digital converters ADC1 and ADC3, respectively, through the respective first and third readout lines V0 and V2 and the respective second and fourth lines VV1 and VV3.

The other pixel signals may be read out in the same readout order as that of the synthesized first to 12$^{th}$ pixel signals 0 to 11.

In the first sum mode, as the first to third control signals DCG_O<2:0> are deactivated, the first to third switches SWO0, SWO1 and SWO2 may be continuously opened. Accordingly, the first to third floating diffusion nodes FDO0, FDO1 and FDO2 may be electrically isolated from one another. In the first sum mode, as the first to third control signals DCG_E<2:0> are deactivated, the first to third switches SWE0, SWE1 and SWE2 may be continuously opened. Accordingly, the first to third floating diffusion nodes FDE0, FDE1 and is FDE2 may be electrically isolated from one another. Although it is described as an example in the present embodiment that the deactivated control signals DCGO<0:2> and DCGE<0:2> are generated during the readout period RS in the first sum mode, the present disclosure is not necessarily limited thereto, and at least one of the control signals DCGO<0:2> and DCGE<0:2> may be selectively activated during at least the first to third time sections.

Moreover, when at least one phase detection pixel is included in the first and second sub-pixel arrays, the process of reading out a pixel signal from the phase detection pixel in the first sum mode may be omitted, or may be performed at a different time from the process of reading out a pixel signal from the active pixel.

Next, an operation of the image sensor 100 according to the second sum mode, i.e., the 9-sum mode, is described with reference to FIGS. 11 and 12.

Figure 11:
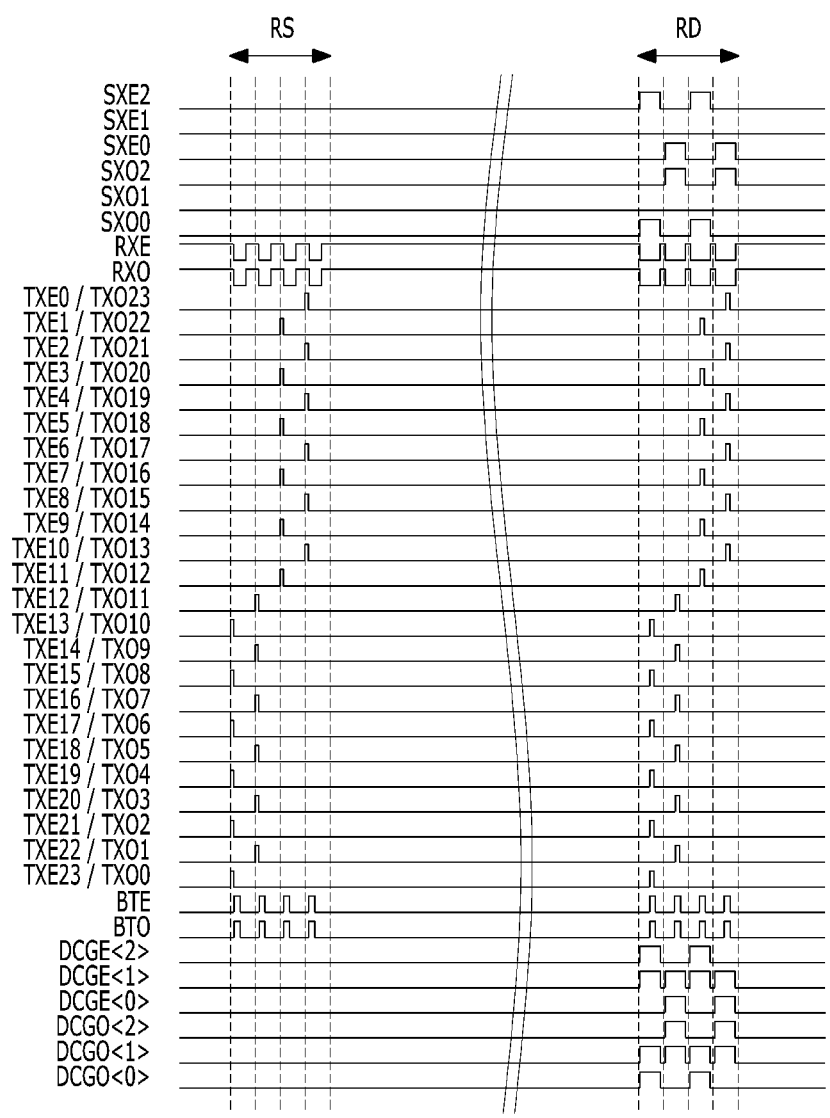
FIG. 11 is a timing diagram illustrating an operation of the image sensor illustrated in FIG. 1 according to a second sum mode, i.e., a 9-sum mode in accordance with an embodiment of the present disclosure.

FIG. 11 is a timing diagram illustrating the operation of the image sensor 100 according to the second sum mode in accordance with an embodiment of the present disclosure. FIG. 12 is a diagram additionally illustrating the operation of the image sensor 100 according to the second sum mode illustrated in FIG. 11 in accordance with an embodiment of the present disclosure.

Figure 12:
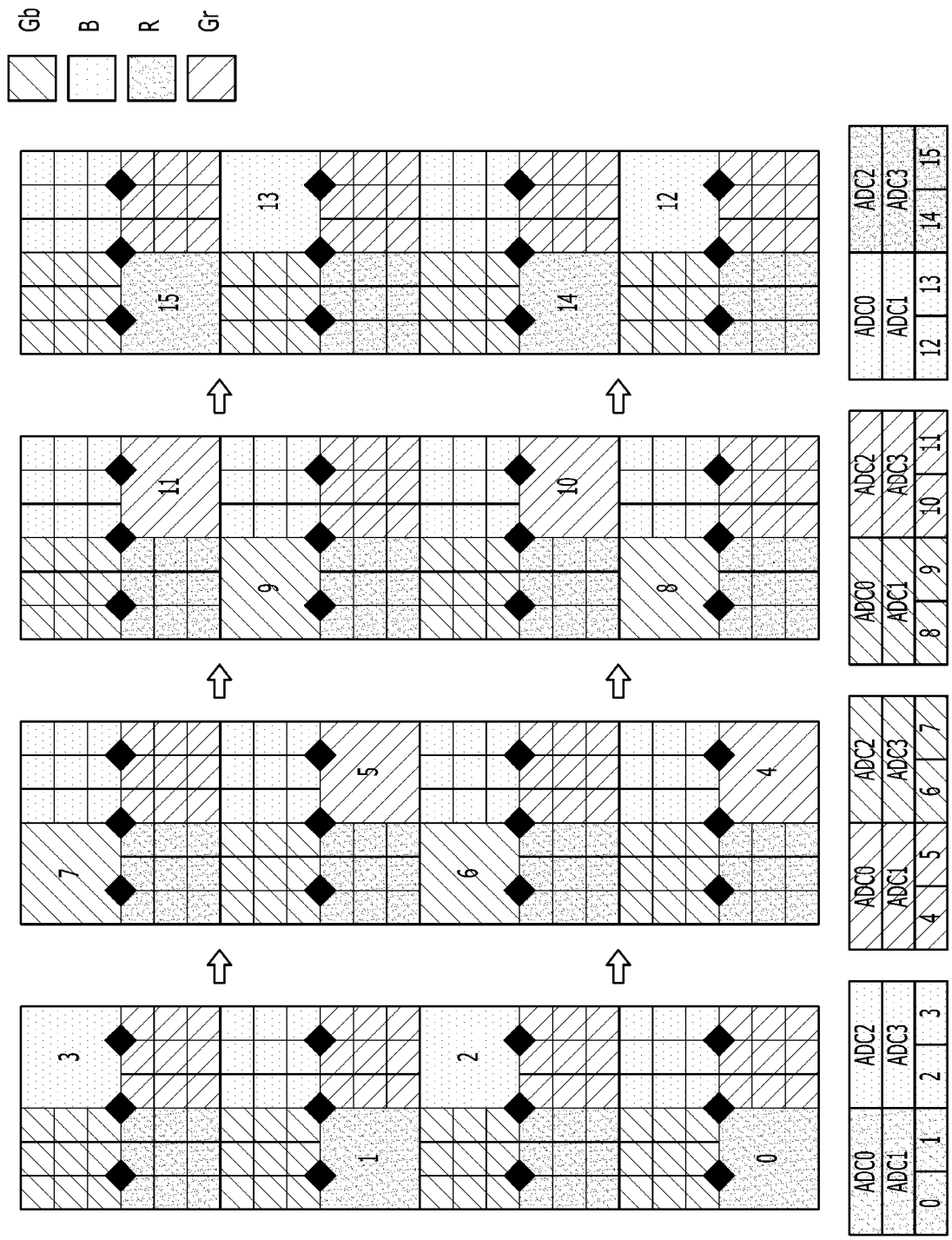
FIG. 12 is a diagram additionally illustrating the operation of the image sensor according to the second sum mode illustrated in FIG. 11 in accordance with an embodiment of the present disclosure.

Referring to FIGS. 11 and 12 together, in the second sum mode, the pixel signals PXOUTs synthesized from a plurality of pixels included in the pixel array 120 may be read out.

The image sensor 100 may reset the plurality of pixels in a predetermined second order during a reset period RS. For example, charges remaining in first to 36$^{th}$ photodiodes and the first to third floating diffusion nodes FDO0, FDO1 and FDO2 included in the first sub-pixel array may be emitted or removed, and charges remaining in first to 36$^{th}$ photodiodes and the first to third floating diffusion nodes FDE0, FDE1 and FDE2 included in the second sub-pixel array may be emitted or removed.

The image sensor 100 may read out the pixel signals PXOUTs synthesized from the plurality of pixels during a readout period RD.

For example, the first sub-pixel array may output a first pixel signal 0 synthesized from all pixels, i.e., 9 pixels, each having a red filter R, on the basis of the first, third, fifth, seventh, ninth and 11$^{th}$ transmission control signals TXO0, TXO2, TXO4, TXO6, TXO8 AND TXO10 simultaneously activated during a first time section. Although not illustrated in FIG. 11, the third sub-pixel array may output a second pixel signal 1 synthesized from all pixels, i.e., 9 pixels, each having a red filter R, on the basis of first, third, fifth, seventh, ninth and 11$^{th}$ transmission control signals simultaneously activated during the first time section. The second sub-pixel array may output a third pixel signal 2 synthesized from all pixels, i.e., 9 pixels, each having a blue filter B, on the basis of the 14$^{th}$, 16$^{th}$, 18$^{th}$, 20$^{th}$, 22$^{nd}$ and 24$^{th}$ transmission control signals TXE13, TXE15, TXE17, TXE19, TXE21 and TXE23 simultaneously activated during the first time section. Although not illustrated in FIG. 11, the fourth sub-pixel array may output a fourth pixel signal 3 synthesized from all pixels, i.e., 9 pixels, each having a blue filter B, on the basis of 14$^{th}$, 16$^{th}$, 18$^{th}$, 20$^{th}$, 22$^{nd}$ and 24$^{th}$ transmission control signals simultaneously activated during the first time section. The synthesized first to fourth pixel signals 0 to 3 may be inputted to the first to fourth analog/digital converters ADC0, ADC1, ADC2 and ADC3 via the switch circuit 151. For example, the synthesized first and second pixel signals 0 and 1 may be outputted to the first and second analog/digital converters ADC0 and ADC1, respectively, through the respective first and fourth readout lines V0 and V3 and the respective first and second lines VV0 and VV1, and the synthesized third and fourth pixel signals 2 and 3 may be outputted to the third and fourth analog/digital converters ADC2 and ADC3, respectively, through the respective third and sixth readout lines V2 and V5 and the respective third and fourth lines VV2 and VV3.

Subsequently, the first sub-pixel array may output a fifth pixel signal 4 synthesized from all pixels, i.e., 9 pixels, each having a green filter Gr, on the basis of the second, fourth, sixth, eighth, $10^{th}$ and $12^{th}$ transmission control signals TXO1, TXO3, TXO5, TXO7, TXO9 and TXO11 simultaneously activated during a second time section. Although not illustrated in FIG. 11, the third sub-pixel array may output a sixth pixel signal 5 synthesized from all pixels, i.e., 9 pixels, each having a green filter Gr, on the basis of second, fourth, sixth, eighth, $10^{th}$ and $12^{th}$ transmission control signals simultaneously activated during the second time section. The second sub-pixel array may output a seventh pixel signal 6 synthesized from all pixels, i.e., 9 pixels, each having a green filter Gb, on the basis of the $13^{th}$, $15^{th}$, $17^{th}$, $19^{th}$, $21^{st}$ and $23^{rd}$ transmission control signals TXE12, TXE14, TXE16, TXE18, TXE20 and TXE22 simultaneously activated during the second time section. Although not illustrated in FIG. 11, the fourth sub-pixel array may output an eighth pixel signal 7 synthesized from all pixels, i.e., 9 pixels, each having a green filter Gb, on the basis of $13^{th}$, $15^{th}$, $17^{th}$, $19^{th}$, $21^{st}$ and $23^{rd}$ transmission control signals simultaneously activated during the second time section. The synthesized fifth to eighth pixel signals 4 to 7 may be inputted to the first to fourth analog/digital converters ADC0, ADC1, ADC2 and ADC3 via the switch circuit 151. For example, the synthesized fifth and sixth pixel signals 4 and 5 may be outputted to the first and second analog/digital converters ADC0 and ADC1, respectively, through the respective third and sixth readout lines V2 and V5 and the respective first and second lines VV0 and VV1, and the synthesized seventh and eighth pixel signals 6 and 7 may be outputted to the third and fourth analog/digital converters ADC2 and ADC3, respectively, through the respective first and fourth readout lines V0 and V3 and the respective third and fourth lines VV2 and VV3.

Continuously, the first sub-pixel array may output a ninth pixel signal 8 synthesized from all pixels, i.e., 9 pixels, each having a green filter Gb, on the basis of the $13^{th}$, $15^{th}$, $17^{th}$, $19^{th}$, $21^{st}$ and $23^{rd}$ transmission control signals TXO12, TXO14, TXO16, TXO18, TXO20 and TXO22 simultaneously activated during a third time section. Although not illustrated in FIG. 11, the third sub-pixel array may output a $10^{th}$ pixel signal 9 synthesized from all pixels, i.e., 9 pixels, each having a green filter Gb, on the basis of $13^{th}$, $15^{th}$, $17^{th}$, $19^{th}$, $21^{st}$ and $23^{rd}$ transmission control signals simultaneously activated during the third time section. The second sub-pixel array may output an $11^{th}$ pixel signal 10 synthesized from all pixels, i.e., 9 pixels, each having a green filter Gr, on the basis of the second, fourth, sixth, eighth, $10^{th}$ and $12^{th}$ transmission control signals TXE1, TXE3, TXE5, TXE7, TXE9 and TXE11 simultaneously activated during the third time section. Although not illustrated in FIG. 11, the fourth sub-pixel array may output a $12^{th}$ pixel signal 11 synthesized from all pixels, i.e., 9 pixels, each having a green filter Gr, on the basis of second, fourth, sixth, eighth, $10^{th}$ and $12^{th}$ transmission control signals simultaneously activated during the third time section. The synthesized ninth to $12^{th}$ pixel signals 8 to 11 may be inputted to the first to fourth analog/digital converters ADC0, ADC1, ADC2 and ADC3 via the switch circuit 151. For example, the synthesized ninth and $10^{th}$ pixel signals 8 and 9 may be outputted to the first and second analog/digital converters ADC0 and ADC1, respectively, through the respective first and fourth readout lines V0 and V3 and the respective first and second lines VV0 and VV1, and the synthesized $11^{th}$ and $12^{th}$ pixel signals 10 and 11 may be outputted to the third and fourth analog/digital converters ADC2 and ADC3, respectively, through the respective third and sixth readout lines V2 and V5 and the respective third and fourth lines VV2 and VV3.

Continuously, the first sub-pixel array may output a $13^{th}$ pixel signal 12 synthesized from all pixels, i.e., 9 pixels, each having a blue filter B, on the basis of the $14^{th}$, $16^{th}$, $18^{th}$, $20^{th}$, $22^{nd}$ and $24^{th}$ transmission control signals TXO13, TXO15, TXO17, TXO19, TXO21 and TXO23 simultaneously activated during a fourth time section. Although not illustrated in FIG. 11, the third sub-pixel array may output a $14^{th}$ pixel signal 13 synthesized from all pixels, i.e., 9 pixels, each having a blue filter B, on the basis of $14^{th}$, $16^{th}$, $18^{th}$, $20^{th}$, $22^{nd}$ and $24^{th}$ transmission control signals simultaneously activated during the fourth time section. The second sub-pixel array may output a $15^{th}$ pixel signal 14 synthesized from all pixels, i.e., 9 pixels, each having a red filter R, on the basis of the first, third, fifth, seventh, ninth and $11^{th}$ transmission control signals TXE0, TXE2, TXE4, TXE6, TXE8 and TXE10 simultaneously activated during the fourth time section. Although not illustrated in FIG. 11, the fourth sub-pixel array may output a $16^{th}$ pixel signal 15 synthesized from all pixels, i.e., 9 pixels, each having a red filter R, on the basis of first, third, fifth, seventh, ninth and $11^{th}$ transmission control signals simultaneously activated during the fourth time section. The synthesized $13^{th}$ to $16^{th}$ pixel signals 12 to 15 may be inputted to the first to fourth analog/digital converters ADC0, ADC1, ADC2 and ADC3 is via the switch circuit 151. For example, the synthesized $13^{th}$ and $14^{th}$ pixel signals 12 and 13 may be outputted to the first and second analog/digital converters ADC0 and ADC1, respectively, through the respective third and sixth readout lines V2 and V5 and the respective first and second lines VV0 and VV1, and the synthesized $15^{th}$ and $16^{th}$ pixel signals 14 and 15 may be outputted to the third and fourth analog/digital converters ADC2 and ADC3, respectively, through the respective first and fourth readout lines V0 and V3 and the respective third and fourth lines VV2 and VV3.

In the second sum mode, as the first to third control signals DCG_O<2:0> are selectively activated during the first to fourth time sections, the first to third switches SWO0, SWO1 and SWO2 may be selectively shorted. Accordingly, at least two of the first to third floating diffusion nodes FDO0, FDO1 and FDO2 may be electrically coupled to each other. For example, among first to third pixel groups included in each of the first and third sub-pixel arrays, a first floating diffusion node included in the first pixel group and a second floating diffusion node included in the second pixel group may be coupled to each other during at least the first time section. Among the first to third pixel groups included in the first and third sub-pixel arrays, respectively, the second floating diffusion node included in the second pixel group and a third floating diffusion node included in the third pixel group may be coupled to each other during at least the second time section. Among the first to third pixel groups included in the first and third sub-pixel arrays, respectively, the first floating diffusion node included in the first pixel group and the second floating diffusion node included in the second pixel group may be coupled to each other during at least the third time section. Among the first to third pixel groups included in the first and third sub-pixel arrays, respectively, the second floating diffusion node included in the second pixel group and the third floating diffusion node included in the third pixel group may be coupled to each other during at least the fourth time section.

In the second sum mode, as the first to third control signals DCG_E<2:0> are selectively activated during the first to fourth time sections, the first to third switches SWE0, SWE1 and SWE2 may be selectively shorted. Accordingly, at least two of the first to third floating diffusion nodes FDE0, FDE1 and FDE2 may be electrically coupled to each other. For example, among first to third pixel groups included in the second and fourth sub-pixel arrays, respectively, a second floating diffusion node included in the second pixel group and a third floating diffusion node included in the third pixel group may be coupled to each other during at least the first time section. Among the first to third pixel groups included in the second and fourth sub-pixel arrays, respectively, the first floating diffusion node included in the first pixel group and the second floating diffusion node included in the second pixel group may be coupled to each other during at least the second time section. Among the first to third pixel groups included in the second and fourth sub-pixel arrays, respectively, the second floating diffusion node included in the second pixel group and the third floating diffusion node included in the third pixel group may be coupled to each other during at least the third time section. Among the first to third pixel groups included in the second and fourth sub-pixel arrays, respectively, the first floating diffusion node included in the first pixel group and the second floating diffusion node included in the second pixel group may be coupled to each other during at least the fourth time section.

In the second sum mode, the first to fourth sub-pixel arrays may read out pixel signals through the first, third, fourth and sixth readout lines V0, V2, V3 and V5, and may not read out pixel signals through the second and fifth readout lines V1 and V4. Accordingly, in the second sum mode, second selection control signals, for example, SXO1 and SXE1, inputted to a second pixel group, that is, a pixel group disposed in the middle of the first to third pixel groups, coupled to the second readout line V1 or the fifth readout line V4 among the first to third pixel groups included in each of the first to fourth sub-pixel arrays may be continuously deactivated during the readout period RS.

Moreover, when at least one phase detection pixel is included in the first to fourth sub-pixel arrays, the process of reading out a pixel signal from the phase detection pixel in the second sum mode may be omitted, or may be performed at a different time from the process of reading out a pixel signal from the active pixel.

According to an embodiment of the present disclosure, even though an arrangement pattern of pixels included in a pixel group and an arrangement pattern of color filters of a pixel array are different from each other, a sum mode may be supported.

According to an embodiment of the present disclosure, since a sum mode is supported even though an arrangement pattern of pixels included in a pixel group and an arrangement pattern of color filters of a pixel array are different from each other, performance of an image sensor may be improved.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. An image sensor comprising:
   a first sub-pixel array including a plurality of first pixel groups, which are respectively coupled to a plurality of first readout lines extending in a first direction and are adjacent to one another in a second direction intersecting the first direction; and
   a plurality of first switches suitable for selectively coupling a plurality of first floating diffusion nodes included in the plurality of first pixel groups, based on a plurality of first control signals,
   wherein an arrangement pattern of the plurality of first pixel groups and an arrangement pattern of color filters of the first sub-pixel array are different from each other.

2. The image sensor of claim 1, wherein the plurality of first pixel groups are odd-numbered pixel groups, and the plurality of first control signals are odd-numbered control signals corresponding to the odd-numbered pixel groups.

3. The image sensor of claim 1, wherein each of the plurality of first pixel groups includes even-numbered pixels, and each of a plurality of color filter groups included in the first sub-pixel array includes odd-numbered color filters.

4. The image sensor of claim 1, wherein photodiodes of pixels included in each of the plurality of first pixel groups share one of the plurality of first floating diffusion nodes.

5. The image sensor of claim 1, wherein the plurality of first switches electrically couple some or all of the plurality of first floating diffusion nodes in a sum mode, and electrically isolate each of the plurality of first floating diffusion nodes in a normal mode.

6. The image sensor of claim 1, further comprising:
   a second sub-pixel array including a plurality of second pixel groups, which are respectively coupled to a plurality of second readout lines extending in the first direction and are adjacent to one another in the second direction; and
   a plurality of second switches suitable for selectively coupling a plurality of second floating diffusion nodes included in the plurality of second pixel groups, based on a plurality of second control signals.

7. The image sensor of claim 6, wherein the first and second sub-pixel arrays are adjacent to each other in the first direction.

8. The image sensor of claim 6, wherein the plurality of second pixel groups are odd-numbered pixel groups, and the plurality of second control signals are odd-numbered control signals corresponding to the odd-numbered pixel groups.

9. The image sensor of claim 8, wherein each of the plurality of second pixel groups includes even-numbered pixels, and each of a plurality of color filter groups included in the second sub-pixel array includes odd-numbered color filters.

10. The image sensor of claim 6, wherein photodiodes of pixels included in each of the plurality of second pixel groups share one of the plurality of second floating diffusion nodes.

11. The image sensor of claim 6, wherein the plurality of second switches electrically couple some or all of the plurality of second floating diffusion nodes in a sum mode, and electrically isolate each of the plurality of second floating diffusion nodes in a normal mode.

12. The image sensor of claim 6, wherein an arrangement pattern of the plurality of second pixel groups and an arrangement pattern of color filters of the second sub-pixel array are different from each other.

13. An image sensor comprising:
   a first sub-pixel array including a plurality of first pixel groups, which are respectively coupled to a plurality of first readout lines extending in a vertical direction and are adjacent to one another in a horizontal direction;

a plurality of first switches suitable for selectively coupling a plurality of first floating diffusion nodes included in the plurality of first pixel groups, based on a plurality of first control signals;

a second sub-pixel array including a plurality of second pixel groups, which are respectively coupled to a plurality of second readout lines extending in the vertical direction and are adjacent to one another in the horizontal direction;

a plurality of second switches suitable for selectively coupling a plurality of second floating diffusion nodes included in the plurality of second pixel groups, based on a plurality of second control signals;

a third sub-pixel array including a plurality of third pixel groups, which are respectively coupled to the plurality of second readout lines and are adjacent to one another in the horizontal direction;

a plurality of third switches suitable for selectively coupling a plurality of third floating diffusion nodes included in the plurality of third pixel groups, based on a plurality of third control signals;

a fourth sub-pixel array including a plurality of fourth pixel groups, which are respectively coupled to the plurality of first readout lines and are adjacent to one another in the horizontal direction; and a plurality of fourth switches suitable for selectively coupling a plurality of fourth floating diffusion nodes included in the plurality of fourth pixel groups, based on a plurality of fourth control signals, wherein the first to fourth sub-pixel arrays are adjacent to one another in the vertical direction, wherein the plurality of first to fourth pixel groups each are odd-numbered pixel groups, and wherein the plurality of first to fourth control signals each are odd-numbered control signals corresponding to the odd-numbered pixel groups.

14. The image sensor of claim 13,
wherein each of the plurality of first to fourth pixel groups includes even-numbered pixels, and wherein each of a plurality of color filter groups included in each of the first to fourth sub-pixel arrays includes odd-numbered color filters.

15. The image sensor of claim 13,
wherein photodiodes of pixels included in each of the plurality of first pixel groups share one of the plurality of first floating diffusion nodes, wherein photodiodes of pixels included in each of the plurality of second pixel groups share one of the plurality of second floating diffusion nodes, wherein photodiodes of pixels included in each of the plurality of third pixel groups share one of the plurality of third floating diffusion nodes, and wherein photodiodes of pixels included in each of the plurality of fourth pixel groups share one of the plurality of fourth floating diffusion nodes.

16. The image sensor of claim 13,
wherein the plurality of first switches electrically couple some or all of the plurality of first floating diffusion nodes in a sum mode, and electrically isolate each of the plurality of first floating diffusion nodes in a normal mode, wherein the plurality of second switches electrically couple some or all of the plurality of second floating diffusion nodes in the sum mode, and electrically isolate each of the plurality of second floating diffusion nodes in the normal mode, wherein the plurality of third switches electrically couple some or all of the plurality of third floating diffusion nodes in the sum mode, and electrically isolate each of the plurality of third floating diffusion nodes in the normal mode, and wherein the plurality of fourth switches electrically couple some or all of the plurality of fourth floating diffusion nodes in the sum mode, and electrically isolate each of the plurality of fourth floating diffusion nodes in the normal mode.

17. The image sensor of claim 13, wherein an arrangement pattern of each of the plurality of first to fourth pixel groups and an arrangement pattern of color filters of each of the first to fourth sub-pixel array are different from each other.

* * * * *